United States Patent [19]

Guess

[11] Patent Number: 5,092,967

[45] Date of Patent: Mar. 3, 1992

[54] PROCESS FOR FORMING PRINTED CIRCUITS

[75] Inventor: Robert G. Guess, Beverly, Mass.

[73] Assignee: Romar Technologies Incorporated, Beverly, Mass.

[21] Appl. No.: 716,400

[22] Filed: Jun. 17, 1991

[51] Int. Cl.⁵ .............................................. C25D 5/02
[52] U.S. Cl. ................................. 205/126; 205/167/; 205/926/
[58] Field of Search ............................... 204/15, 38.4

[56] References Cited

U.S. PATENT DOCUMENTS 2,872,391 2/1959 Hauser .................................. 204/15

Primary Examiner—T. M. Tufariello
Attorney, Agent, or Firm—Paul J. Cook

[57] ABSTRACT

Printed electrical circuits are formed by coating an electrically insulating substrate with a layer of nickel metal followed by electroplating a second metal layer in a pattern of the desired circuit. Exposed nickel is removed from the substrate by reacting it with carbon monoxide to form nickel carbonyl vapor while the second metal remains unreacted. The nickel carbonyl vapor is heated to form nickel metal and carbon monoxide.

22 Claims, No Drawings

PROCESS FOR FORMING PRINTED CIRCUITS

BACKGROUND OF THE INVENTION

This invention relates to a stepwise process for forming printed circuits which includes a step of selectively etching a first metal layer while retaining a second metal layer which forms the printed circuit intact.

Prior to the present invention, printed circuits have been formed by additive, semi-additive or subtractive processes. Most commonly existing processes are subtractive processes based upon starting with a copper foil laminated to one or both sides of a substrate, which is either a rigid sheet or a flexible film material. In common processes, electrical connections are provided between foil layers on two sides of a substrate (board) or between the foil layers of multilayered boards. After electroplating copper onto circuit surfaces to a desired thickness, the portion of the copper foil laminate which does not form the printed circuit is removed by contacting it directly with a liquid etching composition which dissolves the excess copper. In this step, the portion of the metal laminate forming the circuit must be protected by a resistant coating that is usually either a polymeric composition or a thin plated layer of tin and lead alloy.

Using liquid chemical etchents for dissolving this copper has two undesirable results. It causes some etching of copper that comprises the desired circuit pattern along and under the edges of the protective mask layer. This limits the fineness of lines that can be formed and thus the number and spacing of lines on a given area of a board.

Electroless copper plating and chemical etching of copper also results in the formation of chelated solutions of copper that must be treated and handled as hazardous wastes. In order to effect safe disposal of these metal containing solutions, they must be treated to remove the metal content prior to disposal. The required wastewater treatment processes are costly and time consuming since they require the use of reagents and capital equipment as well as skilled personnel trained in the handling of such solutions and reagents.

It has been proposed in U.S. Pat. No. 4,659,426 to utilize a plasma containing a halogen based gas and either carbon monoxide or carbon dioxide in order to etch fine lines in a thin metal coating on a substrate. A variety of metals and metallic compounds can be etched by this process which is described as a method for fabricating an integrated circuit such as on a chip of silicon. This process is undesirable for fabricating a printed circuit since it requires an expensive apparatus for producing a plasma capable of etching fine lines and the high plasma temperatures would exceed the normal limits of common printed circuit substrate materials.

It is also known by the Mond Process that nickel reacts with carbon monoxide at about 80° C. to form gaseous nickel carbonyl which dissociates to form metallic nickel particles and carbon monoxide gas at about 200° centigrade.

Accordingly, it would be desirable to provide a process for producing printed circuits which eliminates using electroless copper plating and liquid chemical etching of metals. Additionally, it would be desirable to provide a process for recovering etched metal for recycling and reuse. Furthermore, it would be desirable to provide such a process which eliminates the need for much of the expensive equipment used for forming printed circuits and for treating the wastes produced by existing methods.

SUMMARY OF THE INVENTION

In accordance with this invention, a printed circuit is formed by coating a substrate with a thin layer of electroless nickel followed by electroplating of copper to a desired thickness only on the area that forms the desired printed circuit. The nickel coating provides the means for binding the copper layer to the substrate and upon later removal of excess nickel, producing insulating areas between the electrically conductive copper paths forming the circuit.

The circuit pattern is produced on the electroless nickel layer by forming a negative image of the desired circuit in a dry film photoresist applied to the nickel coating. Upon development of the photoresist film, only those portions of the nickel coating that comprise the desired circuit pattern are bare and exposed. The remainder of the nickel coating is covered with the adherant dry film resist material. An electrically conductive metal which does not react with heated carbon monoxide such as silver, gold or copper is then electroplated to a desired thickness onto the exposed nickel layer in the form of the desired circuit. The nickel layer provides the necessary electrical conductivity and continuity for the plating to take place on all the otherwise disconnected areas of the circuit pattern.

The photoresist is removed to expose the nickel surface that is not covered with copper, silver or gold. The exposed nickel is selectively removed from the substrate by reaction with heated carbon monoxide gas to form gaseous nickel tetracarbonyl. The gaseous nickel tetracarbonyl is then heated to a higher temperature causing it to dissociate and form nickel metal particles and carbon monoxide gas. By selectively removing the nickel from the substrate, insulating areas comprising the substrate material are formed between the conductive copper paths that form the desired circuit. The specificity of carbon monoxide gas at these conditions for removing only the nickel and not the copper, silver or gold allows the forming of very narrow and closely spaced lines of copper on the circuit board substrate.

DESCRIPTION OF SPECIFIC EMBODIMENTS

A substrate is coated with electroless nickel by any conventional means such as is disclosed in U.S. Pat. Nos. 4,725,799; 4,725,504; 4,806,395; 4,832,795; 4,868,071; 4,894,124 and 4,950,553 which are incorporated herein by reference. In a typical process, an electrically insulating substrate such as a polyimide or epoxy-fiberglass is contacted with a catalyst which promotes nickel precipitation from solution such as colloidal palladium. The substrate then is immersed into an electroless nickel salt solution to effect electroless nickel deposition onto the substrate. Suitable electroless nickel baths are disclosed in U.S. Pat. Nos. 3,062,666; 3,140,188; 3,338,726; 3,531,301; 3,537,878 and 3,562,038 which are incorporated herein by reference.

Prior to electroless nickel deposition, through holes can be formed through the substrate when the substrate is to be coated on two opposing surfaces with a printed circuit. During nickel deposition and subsequent copper electroplating, the through holes are coated with nickel and the copper to form an electrically conductive path between the circuits. The term "nickel" as used herein includes nickel metal as well as nickel alloys such as nickel/boron alloys and nickel/phosphorous alloys. Nickel also can be applied by other conventional means such as by lamination with an adhesive of a nickel metal foil. Subsequent to forming the nickel coating, a negative image of the desired circuit is formed with a conventional film photoresist. A solution form or dry film photo-resist is applied to the nickel coating and then is imaged through a negative photomask to form a solid film in a negative circuit pattern.

The copper, silver or gold circuit then is electroplated onto the exposed nickel utilizing a conventional copper electroplating process. Copper is the preferred metal to form common circuits since it is inexpensive and does not react with carbon monoxide to form a non-solid product. Other metals such as silver or gold which are more electrically conductive than copper can be used for special design electrical circuits, if desired. Thus, in accordance with this invention, nickel can be removed selectively from the substrate without adversely affecting the conductive metallic circuit.

The photoresist is removed from the substrate with a solvent that dissolves the photoresist but which does not solubilize nickel, copper, silver or gold in order to expose the nickel layer in the form of the negative image of the copper circuit.

The formed circuit then is exposed to a carbon monoxide gas composition heated to a temperature between about 60° C. and 100° C., preferably between about 75° C. and 85° C. This contact is maintained for a period of time sufficient to selectively convert the exposed nickel to nickel carbonyl gas, primarily as nickel tetracarbonyl, while the circuit metal, e.g.,copper remains substantially unaffected. The carbon monoxide can be pure carbon monoxide or carbon monoxide diluted with an inert gas such as nitrogen, argon, helium, or carbon dioxide. The carbon monoxide gas composition can be circulated continuously or intermittently into an airtight reaction chamber containing the circuit to be treated.

The gas composition exiting the reaction chamber contains vaporous nickel tetracarbonyl. It is heated to a temperature sufficient to effect the formation of solid nickel metal particles, that is between about 150° C. and 250° C., preferably between about 190° C. and 210° C., and then filtered to separate the nickel metal from the carbon monoxide gas composition. The particles of metallic nickel are removed from the gas at this elevated temperature and the carbon monoxide is then cooled and recirculated to the reaction chamber at the lower temperature at which nickel carbonyl is formed. The pure metallic nickel is recovered usually as particles and can be reclaimed and recycled for any uses requiring such purity and form. A preferred use is for producing additional electroless nickel liquid composition.

A typical stepwise procedure that can be utilized in the present invention is as follows:

1. Start with clean circuit board substrate, either rigid or flexible, with no copper foil cladding or laminate on the board. Drill, if required, all the required mounting and interply holes through the substrate board, deburr, clean, and dry the boards.

2. Apply electroless nickel plating on the entire surface of the substrate to establish a thickness of nickel sufficient to carry electroplating current, which is between about 1.0 mil and 100 mils thickness. After electroless nickel plating, the board is rinsed in countercurrent stages using deionized water to remove all traces of nickel bath chemistry.

3. A negative photoresist film is applied, exposed, and developed on the board. That portion of the resist film which comprises the image of the desired circuit pattern is removed. This exposes the plated nickel surface only on all those areas comprising the circuit, including the through hole surfaces in the board.

4. The board is immersed in a conventional acid copper sulfate plating bath and direct plating voltage is applied between the board as the cathode and metallic copper shapes as the anode. Electrical conductivity between the terminals gripping the board and the exposed circuit pattern is effected by the conductive electroless nickel layer covering the substrate. Metallic copper is plated only on the unmasked area comprising the desired circuit pattern. Electroplated copper is deposited at a controlled rate and condition and for a time suitable for producing the desired quality and thickness of deposited copper in the form of the desired circuit. Upon removal from the copper electroplating bath, the board is thoroughly rinsed with deionized water and dried.

5. When a tin lead alloy coating over the surface of the copper circuit pattern is required for soldering adhesion, the tin-lead electroplating deposit can be applied before the next step is carried out.

6. The photoresist mask is removed by solvent washing and dissolution of the resist material. This exposes the remaining thin layer of electroless nickel in the negative image of the copper circuit pattern. The board is washed to remove any remaining trace of resist or solvent material and then thoroughly dried.

7. The board is placed inside an airtight enclosure that is connected to a supply of temperature controlled carbon monoxide containing gas composition. The gas composition is safely fed and circulated throughout the enclosure in contact with the exposed nickel surfaces. The carbon monoxide reacts with the nickel content thereof, forming a volatile nickel tetracarbonyl component of the exiting gas composition. A continuous supply of reactive carbon monoxide gas composition is provided at a suitable temperature and for a suitable time as to completely eliminate the metallic nickel from the areas of the board that are not copper plated. Upon completion of this nickel removing step, the enclosure is purged and cooled and made safe to open and the treated board is removed.

8. The board then can be cleaned to remove any non-nickel residual constituent of the nickel plating composition, such as phosphorous or boron compounds. This produces an essentially completed electrical circuit board, ready for further processing into multilayered configurations and or assembly of electronic components.

I claim:

1. The process for forming a printed electrical circuit on an electrically insulating substrate which comprises:
   depositing an electrically conductive nickel metal layer on a substrate surface,
   depositing a mask on said nickel metal layer in a pattern comprising a negative image of said circuit thereby to expose a nickel metal layer having a pattern of said circuit,
   electroplating an electrically conductive second metal layer on said nickel metal layer having a pattern of said circuit, removing said mask from said nickel metal layer to expose a negative nickel metal image of said circuit, contacting said negative nickel metal image with a carbon monoxide containing gas at a temperature between about 60° C. and 100° C. to effect conversion of exposed nickel metal to vaporous nickel carbonyl while said second metal is unreacted with the carbon monoxide, thereby to selectively remove said exposed nickel metal from said substrate, and heating said vaporous nickel carbonyl to a temperature between about 150° and 250° C. to convert said nickel carbonyl to nickel metal and carbon monoxide.

2. The process for forming a printed circuit on electrically insulating substrate which comprises:

coating a surface of said substrate with an electrically conductive nickel metal layer, electroplating a second metal layer in the form of said circuit on said nickel metal layer to form an exposed negative nickel metal image of said circuit, contacting said negative nickel metal image with a carbon monoxide containing gas at a temperature between about 60° C. and 100° C. to effect conversion of said exposed nickel metal to vaporous nickel carbonyl while said second metal is unreacted with carbon monoxide, thereby to selectively remove said exposed nickel metal from said substrate, and heating said vaporous nickel carbonyl to a temperature between about 150° and 200° C. to convert said nickel carbonyl to nickel metal and carbon monoxide.

3. The process of any one of claims 1 or 2 wherein said second metal is copper.

4. The process of any one of claims 1 or 2 wherein said substrate is coated with an electrical copper circuit on two opposing substrate surfaces.

5. The process of claim 1 wherein said substrate is a polyimide.

6. The process of claim 2 wherein said substrate is a polyimide.

7. The process of claim 3 wherein said substrate is a polyimide.

8. The process of claim 4 wherein said substrate is a polyimide.

9. The process for forming a printed electrical circuit on an electrically insulating substrate which comprises:

depositing an electrically conductive nickel metal on a surface of the substrate, depositing a mask on said nickel metal layer in a pattern comprising a negative image of said circuit thereby to expose only the nickel metal layer having a pattern of said circuit, electroplating a second electrically conductive metal layer which does not react with carbon monoxide on said nickel metal layer only on the area having a pattern of said circuit, removing said mask from said nickel metal layer to expose the nickel metal that forms a negative image of said circuit, contacting said negative nickel metal image with a gas composition containing carbon monoxide, with said gas at a temperature between about 60° C. and 100° C. to convert said exposed nickel metal to vaporous nickel carbonyl, thereby to remove said exposed nickel metal from said substrate, separately heating said gas composition containing vaporous nickel carbonyl to a temperature between about 150° and 250° C. to convert said nickel carbonyl to nickel carbonyl to nickel metal and carbon monoxide, washing said insulating substrate with a liquid composition suitable for dissolving and removing residual compounds remaining on the substrate after the nickel layer is removed, and rinsing said liquid composition from the substrate to form an electrically insulating substrate coated with an electrically conductive metal pattern formed by a first layer of nickel metal adhering to the substrate and a second conductive metal layer adhering to said layer of nickel metal.

10. The process of claim 9 wherein said substrate comprises an epoxy fiberglass composite material.

11. The process of claim 9 wherein said substrate is a polyimide composition.

12. The process of claim 9 wherein said nickel metal is deposited by immersing said substrate into an electroless nickel plating bath composition.

13. The process of claim 9 wherein said nickel metal is deposited by laminating with an adhesive a nickel metal foil to the surfaces of said substrate.

14. The process of claim 9 wherein said second electrically conductive and electroplated metal is copper.

15. The process of any one of claims 1, 2 or 9 wherein said second electrically conductive and electroplated metal is silver.

16. The process of any one of claims 1, 2 or 9 wherein said second electrically conductive and electroplated metal is gold.

17. The process of any one of claims 1, 2 or 9 wherein said nickel is deposited from an electroless nickel bath contains at least one compound containing boron.

18. The process of any one of claims 1, 2 or 9 wherein said nickel is deposited from an electroless nickel bath contains one or more compounds containing phosphorous.

19. The process of any one of claims 1, 2 or 9 wherein said gas composition contains a mixture of carbon monoxide and carbon dioxide.

20. The process of claim 1 wherein said gas composition contains a mixture of carbon monoxide diluted with an inert gas selected from the group consisting of nitrogen, helium and argon.

21. The process of any one of claims 1, 2 or 9 wherein a third metal layer is electroplated on the second metal layer.

22. The process of claim 21 wherein said third metal layer comprises a tin-lead alloy.

* * * * *